United States Patent
Schwarzbauer

Patent Number: 5,893,511
Date of Patent: Apr. 13, 1999

[54] PRESSURE SINTERING METHOD FOR FASTENING ELECTRONIC COMPONENTS ON A SUBSTRATE

[75] Inventor: Herbert Schwarzbauer, Munich, Germany

[73] Assignee: Siemens Aktiengesellschaft, Munich, Germany

[21] Appl. No.: 08/709,810

[22] Filed: Sep. 10, 1996

[30] Foreign Application Priority Data

Sep. 11, 1995 [DE] Germany ............... 195 33 561

[51] Int. Cl.$^6$ ................................. B23K 20/16
[52] U.S. Cl. .................... 228/194; 228/193; 228/208
[58] Field of Search ................... 228/193, 194, 228/208

[56] References Cited

U.S. PATENT DOCUMENTS

| 4,810,672 | 3/1989 | Schwarzbauer | 437/209 |
| 4,844,323 | 7/1989 | Kondo et al. | 228/194 |
| 4,903,885 | 2/1990 | Schwarzbauer | 228/193 |
| 4,903,886 | 2/1990 | Schwarzbauer | 228/193 |

FOREIGN PATENT DOCUMENTS 2117691  10/1983  United Kingdom ............ 228/194

OTHER PUBLICATIONS

Eifert et al, "Preparation and DC–Properties of Nanporous Metal Networks", *Int. J. Electronics*, vol. 73, No. 5, pp. 945–947.

Granqvist et al, "Ultrafine Metal Particles", *Journal of Applied Physics*, vol. 47, No. 5, May 1976, pp. 2200–2219.

Primary Examiner—Patrick Ryan
Assistant Examiner—Jeffrey T. Knapp
Attorney, Agent, or Firm—Hill & Simpson

[57] ABSTRACT

In a method for fastening electronic components on a substrate by means of pressure sintering, which includes providing a layer of sinterable metal powder on a surface of one component, assembling the components engaging the layer and then, while exerting a pressure on the components, applying heat to sinter the layer of material, an improvement comprises forming the layer of sinterable metal powder by vaporizing a metal and condensing the metal as a nanocrystalline metal powder on the surface. Preferably, the metal powder is silver and is applied in a precipitation chamber.

12 Claims, 2 Drawing Sheets

1

PRESSURE SINTERING METHOD FOR FASTENING ELECTRONIC COMPONENTS ON A SUBSTRATE

BACKGROUND OF THE INVENTION

The present invention is directed to a method for fastening electronic components on a substrate by means of pressure sintering, wherein a layer of a sinterable metal powder is coated onto one of the contact surfaces of either the component or the substrate. After coating the contact surface, the component and substrate are assembled with the contact surfaces facing one another and are then pressed together with a predetermined pressure and, while in the pressed-together state, heated to a sintering temperature at which the layer is sintered to bond the component on the substrate.

A method for fastening electrical components on a substrate by means of pressure sintering, wherein a layer of sinterable material, such as silver, is provided on one of the contact surfaces, the component and substrate are assembled with their contact surfaces facing each other and engaging the layer, then applying a pressure to a predetermined amount, such as at least 900N/cm², and heating to a range of 180° C. to 250° C. to sinter the layer to form the bond is disclosed in U.S. Pat. No. 4,810,672, whose disclosure is incorporated herein by reference thereto and which claims priority from the same German Application as European 0 242 626. To produce a layer from the metal powder in this known method, a paste is made up of the metal powder and a solvent and this paste is deposited on the contact surface to be coated in the form of a layer. The deposited paste is then dried. Before the component and the substrate are brought together, for better handling of the coated component, the deposited layer is advantageously presintered, for example at a temperature of 250° C.

The layer of metal powder serves as a compensating layer for the surface roughness and must be compressible and porous.

SUMMARY OF THE INVENTION

The object of the present invention is to provide the advantage of manufacturing a layer from a sinterable metal powder, wherein the uniform depositing of the relevant contact surface and the presintering for better manipulation of the component coated with the layer will take place in one work step.

To accomplish these goals, the present invention is directed to an improvement in a process or method for fastening electronic components, in particular large-surface power semiconductors, onto a surface by means of a pressure sintering, which method includes coating a layer of a sinterable metal powder on a contact surface of one of the component and substrate, then assembling the component and substrate with the contact surfaces facing one another and engaging the layer, applying a predetermined pressure and heat to a sintering temperature at which the layer in the pressed-together state is sintered to form the connection. The improvements are that the layer is produced through a precipitation on the contact surface of a nanocrystalline metal powder obtained through a vaporization and condensation of a metal at a gas pressure in the range of 100 Pa to 1000 Pa. Preferably, the precipitation is carried out in a precipitation chamber, the nanocrystalline metal powder is presintered while in the precipitation chamber by means of heating to a temperature in a range of 120° C. to 350° C. The atmosphere is preferably inert gas and, preferably, the nanocrystalline material is silver which is deposited at a pressure in a range of 100 Pa to 1000 Pa in an atmosphere of helium.

2

It is noted that the production of a layer on a surface through precipitation and depositing on the surface of a nanocrystalline metal powder obtained by vaporizing and condensing of metal at low pressure is already known from an article from INT. J. Electronics, 1992, Vol. 73, No. 5, pp. 945–947, and also an article from Journal of Applied Physics, Vol. 47, No. 5, May 1976, pp. 2200–2219. In contrast, the invention rests on the new finding that the method for precipitation of the metal powder, known in itself for these documents, is eminently suited for the production of the layer of a metal powder required for a method for fastening electronic components on a substrate by means of pressure sintering.

Other advantages and features of the invention will be readily apparent from the following description of the preferred embodiments, the drawings and claims.

DESCRIPTION OF THE PREFERRED EMBODIMENTS

Figure 5:
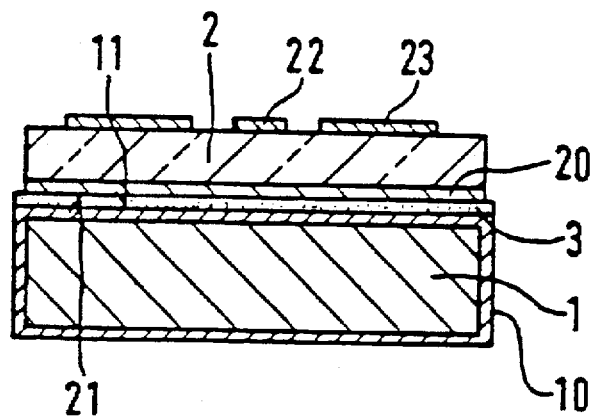
FIG. 5 is a cross sectional view of the component of FIG. 2 being united onto the contact surface of the substrate of FIG. 4.

The principles of the present invention are particularly useful for uniting or bonding a component 2 onto a substrate 1, as illustrated in FIG. 5.

Figure 1:
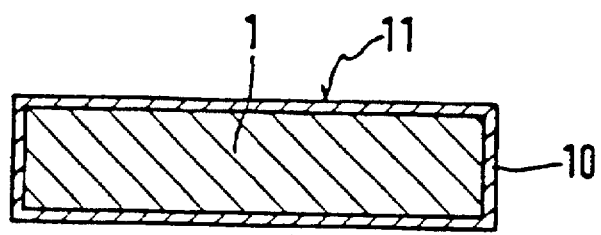
FIG. 1 is a cross sectional view of a substrate according to the present invention.

The substrate 1, as shown in FIG. 1, is a 1.5 mm thick plate made of a material, such as molybdenum, and has a diameter of about 30 mm. The plate is coated on all sides with a contact layer 10 made of, for example, silver to a thickness of 2 µm to 3 µm. A surface 11 of the layer 10 located on the flat side of the substrate 1 will form the contact surface for this substrate 1.

Figure 2:
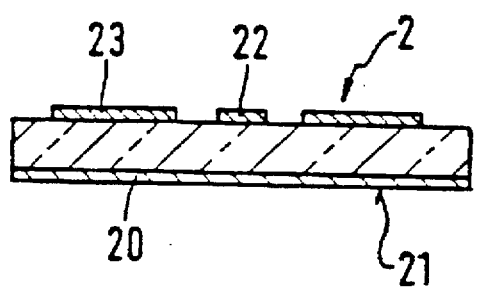
FIG. 2 is a cross sectional view of a large-surface power semiconductor according to the present invention.

The component, generally indicated at 2 in FIG. 2 is, for example, a large-surface thyristor, which, on one of two flat surfaces, has arranged as an aluminum structure, which is an ignition contact 22 and a cathode 23 that has a circular configuration which surrounds the ignition contact 22. A coating 20 is deposited on the other flat surface, which is turned away from this one flat surface of the component 2. The component 2 is made, for example, of silicon and the coating consists specifically, for example, of a 1 µm-thick layer of aluminum, a layer of titanium with a thickness of about 100 nm, a layer of platinum that is, for example, about 100 nm thick and a layer of gold that is about 100 nm thick. The gold layer forms an outer surface of the coating 20 and the surface of this gold layer forms the contact surface 21 for the component 2.

Figure 3:
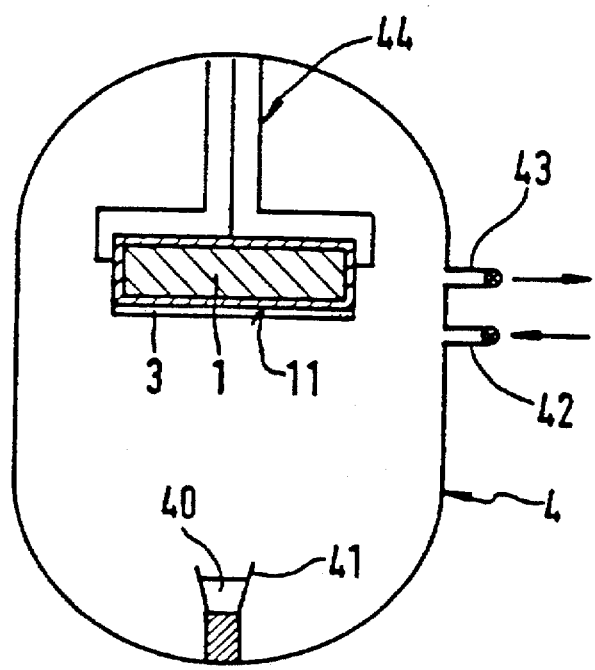
FIG. 3 is a schematic cross sectional view of a precipitation chamber for the production of the layer of the nanocrystalline metal powder on a contact surface of the substrate of FIG. 1.

For the inventive coating with a layer of suitable metal powder, the selected component, for example a substrate 1 or the component 2 or both, are brought into a precipitation chamber 4, which is shown schematically in FIG. 3. The component is mounted in the chamber 4 on a mount 44, whose temperature can be regulated. The mount 44 positions the contact surface 11 of the substrate 1 or 21 of the component 2 to face a pan 41 arranged in the precipitation chamber, which pan receives the metal used for the coating. In the example according to FIG. 3 and for the sake of clarity, only one component, the substrate 1, is arranged in the precipitation chamber 4. The arrangement of the precipitation chamber 4 can also be that shown in FIG. 2 of the above-named article from Journal of Applied Physics and described in Section B of that article.

A layer of suitable metal powder is produced by the metal 40 located in the pan 41 being vaporized and condensed at a lower pre-vacuum pressure of 100 Pa to 1000 Pa so that a fine crystalline and sinterable metal powder, known as a nanocrystalline, is obtained as a fine dust. This fine dust will precipitate on the contact surface 11 in a thin layer 3. In this connection, see the above-named article from the Journal of Applied Physics, and, in particular, Section B on pages 205 and 206. Nanocrystalline metal powder is meant here as a metal powder of a particulate size from 1 nm to 500 nm and preferably not greater than 200 nm, and preferably in a range of from 1 nm to 20 nm.

The vaporization and condensation of the metal 40 and the precipitation and depositing of the vaporized and condensed metal as a layer 3 on the relevant contact layer 11 or 21 is preferably carried out in an atmosphere of inert gas, wherein the inert gas is brought into the interior of the precipitation chamber through an inlet 42 in the chamber 40. Subsequently, it is evacuated through the outlet 43 and as the chamber is brought to a pre-vacuum pressure.

In particular, in the exemplary substrate 1 according to FIG. 1 and the exemplary component 2 according to FIG. 2, the metal preferably consists of silver that has been precipitated and deposited at a pressure in the pressure range of from 100 Pa to 1000 Pa in an atmosphere of helium.

The layer can advantageously be sintered on or presintered already during the depositing, but preferably after the depositing of this layer in the chamber 4, through a slight heating of the mount 44 to a temperature in the temperature range of 120° C. to 350° C. so that the relevant components are advantageously ready for use immediately after the completion of the coating step with the layer 3 and removal from the precipitation chamber 4.

Figure 4:
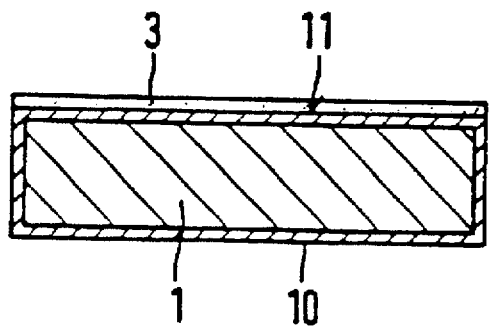
FIG. 4 is a cross sectional view of the substrate of FIG. 1 after applying the coating thereto.

FIG. 4 shows the finished component in the form of a substrate 1 according to FIG. 1 coated with the presintered layer 3 of the nanocrystalline material.

The substrate 1 coated in this way according to FIG. 4 and the component 2 according to FIG. 2 are then assembled and united in a known way so that, as shown in FIG. 5, the contact surface 21 of the component 2 faces the layer 3 of the substrate 1, and this layer 3 is contacted over the whole surface. After this assembly, both components 1 and 2 are pressed together with a determined pressure and are heated to a sintering temperature, at which the layer 3 is sintered in this pressed-together state. As noted in U.S. Pat. No. 4,810, 672, pressures of at least 900N/cm² are desirable for sintering the silver layer at a temperature of 180° C. to 250° C.

Although various minor modifications may be suggested by those versed in the art, it should be understood that I wish to embody within the scope of the patent granted hereon all such modifications as reasonably and properly come within the scope of my contribution to the art.

I claim:

1. In a method for fastening electronic components onto a surface by means of pressure sintering, which method includes coating a layer of a sinterable metal powder on one of the contact surfaces of the component and substrate, after coating the contact surface with the layer, assembling the component and substrate with the contact surfaces facing one another and the layer therebetween, pressing the component and substrate together and, while pressed together, heating to a sintering temperature of the layer to sinter the layer to join the component and substrate together, the improvement comprising the step of coating with a layer being by precipitating a nanocrystalline metal powder on the contact surface, said powder being obtained by vaporizing and then condensing of the metal at a gas pressure in the range of 100 Pa to 1000 Pa, and the sintering temperature being in a range between 120° C. and 350° C.

2. In a method according to claim 1, wherein the layer of nanocrystalline metal powder is a silver precipitate which is precipitated and deposited in a pressure range of 100 Pa to 1000 Pa in an atmosphere of helium.

3. In a method according to claim 1, wherein the nanocrystalline metal powder is a silver precipitate having a size in a range of 1 nm to 500 nm.

4. In a method according to claim 3, wherein the silver precipitate has a size in the range of 1 nm to 20 nm.

5. In a method for fastening electronic components onto a surface by means of pressure sintering, which method includes coating a layer of a sinterable metal powder on one of the contact surfaces of the component and substrate, after coating the contact surface with the layer, assembling the component and substrate with the contact surfaces facing one another and the layer therebetween, pressing the component and substrate together and, while pressed together, heating to a sintering temperature of the layer to sinter the layer to join the component and substrate together, the improvement comprising the step of coating with a layer being by precipitating a nanocrystalline metal powder on the contact surface said powder being obtained by vaporizing and then condensing of the metal at a gas pressure in the range of 100 Pa to 1000 Pa.

6. In a method according to claim 5, wherein the step of precipitating a metal precipitates silver which is deposited in a gas pressure of helium in a range of 100 Pa to 1000 Pa.

7. In a method according to claim 5, wherein the precipitation of the layer of nanocrystalline metal powder on the contact surface is carried out in a precipitation chamber.

8. In a method according to claim 7, wherein the layer of nanocrystalline metal powder is silver which is precipitated and deposited at a pressure in a range of 100 Pa to 1000 Pa in an atmosphere of helium.

9. In a method according to claim 7, wherein the layer of nanocrystalline metal powder that occurs on the contact surface to be coated is presintered in the precipitation chamber by means of heating to a temperature in the range of 120° C. to 350° C.

10. In a method according to claim 9, wherein the layer of nanocrystalline metal powder is a silver precipitate which is precipitated and deposited in a pressure range of 100 Pa to 1000 Pa in an atmosphere of helium.

11. In a method according to claim 9, wherein the precipitation and depositing of the layer is carried out in an atmosphere of inert gas.

12. In a method according to claim 11, wherein the inert gas is helium and the layer is a silver which is precipitated and deposited in a pressure range of 100 Pa to 1000 Pa in an atmosphere of the helium.

* * * * *